(12) United States Patent
Christian

(10) Patent No.: US 7,619,467 B2
(45) Date of Patent: *Nov. 17, 2009

(54) MODULATED TRIANGULAR WAVE AMPLIFIER

(75) Inventor: Kevin Scott Christian, Freeland, WA (US)

(73) Assignee: Dobbs-Stanford Corporation, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/016,113

(22) Filed: Jan. 17, 2008

(65) Prior Publication Data

US 2008/0180167 A1    Jul. 31, 2008

Related U.S. Application Data

(63) Continuation of application No. 10/565,451, filed as application No. PCT/US2004/024020 on Jul. 26, 2004, now Pat. No. 7,332,959.

(60) Provisional application No. 60/489,664, filed on Jul. 24, 2003.

(51) Int. Cl.
   *H03F 3/38* (2006.01)
(52) U.S. Cl. ....................................... 330/10
(58) Field of Classification Search ............... 330/10, 330/207 A, 251; 363/41
   See application file for complete search history.

(56) References Cited

U.S. PATENT DOCUMENTS

| | | | |
|---|---|---|---|
| 4,987,385 A | 1/1991 | Engelmann | |
| 5,451,900 A * | 9/1995 | Haga et al. | 330/10 |
| 5,559,467 A | 9/1996 | Smedley | |
| 5,777,519 A | 7/1998 | Simpopoulos | |
| 6,593,864 B1 * | 7/2003 | Reilly | 341/119 |
| 6,763,114 B1 * | 7/2004 | Nalbant | 381/120 |
| 7,057,456 B2 * | 6/2006 | Taura et al. | 330/207 A |
| 7,161,421 B2 * | 1/2007 | Honda | 330/10 |
| 2002/0140407 A1 * | 10/2002 | Hwang | 323/207 |
| 2002/0167354 A1 | 11/2002 | Stanley | |

FOREIGN PATENT DOCUMENTS

| | | |
|---|---|---|
| EP | 0503571 A1 | 9/1992 |
| WO | 03061117 A | 7/2003 |

* cited by examiner

*Primary Examiner*—Robert Pascal
*Assistant Examiner*—Khiem D Nguyen
(74) *Attorney, Agent, or Firm*—John G. Fischer; Storm LLP

(57) ABSTRACT

The invention is a power amplifier circuit for providing a signal acceptable for use in audio amplifiers or similar applications without requiring a stable power supply free from fluctuations. An alternating current power supply signal rectified to a direct current signal is processed by two voltage multipliers. A voltage divider establishes a unity gain level, and the variance from this voltage is squared by the first voltage multiplier. This squared voltage is then multiplied with a triangular wave signal to generate a modulated triangular wave signal. The modulated triangular wave signal and a signal to be amplified, typically an audio signal, are processed by an internal comparator to generate a pulse width modulated signal. This modulated signal is processed by a power transistor network and filter to provide an amplified signal to a load device. By modulating the triangle wave signal to compensate for fluctuations in the power supply to the amplifier circuit, noise or ripples present in the power supply are demodulated, eliminating the requirement for a regulated power supply.

14 Claims, 11 Drawing Sheets

MODULATED TRIANGULAR WAVE AMPLIFIER

CROSS REFERENCE TO RELATED APPLICATION

This application is a continuation of U.S. patent application Ser. No. 10/565,451, filed Jan. 20, 2006 now U.S. Pat. No. 7,332,959, which claims priority to International Application No. PCT/US2004/024020, filed on Jul. 26, 2004, which claims priority from U.S. Provisional Patent Application No. 60/489,664, filed Jul. 24, 2003.

TECHNICAL FIELD OF INVENTION

The present invention relates to amplifier design, and more particularly to a power amplifier for audio and other signals. Still more specifically, the present invention relates to design of an amplifier circuit capable of manipulating an unregulated AC signal to provide an amplified signal to a load device, so that fluctuations in the power supply to the amplifier circuit are compensated for, and noise or ripples present in the power supply are removed, eliminating the requirement for a regulated power supply.

BACKGROUND OF THE INVENTION

Power amplifiers are commonly used to amplify electrical signals supplying power to certain types of electronic devices, such as audio speakers. Most power amplifiers use, and depend upon, clean, regulated direct current (DC) power input. Unregulated DC power generated from unregulated alternating current (AC) is "noisy", containing power fluctuations unsuitable for most power amplifying applications.

In typical applications, power amplifiers must convert an unregulated, noisy 120-volt AC power source into a regulated, clean DC power source. If the unregulated AC power input is simply rectified to a DC power input, any fluctuations, noise or ripple in the AC power signal may be transferred to the DC power signal. The noise inherent in DC power in this situation may be translated to the amplified output signal. In audio applications, such excessive variances in the power supply will result in undesirable hum, distortions, and noise at the speaker. As such, there is a need for regulated DC power supplies to power applications with a reduced noise factor.

Conventional power amplifiers rectify an AC power source to a regulated DC power source with transformers and other active inductive and capacitive circuits, which account for the majority of the weight, waste heat output, and cost of production associated with these prior-art amplifiers. As such, there is also a need for audio amplifiers that weigh less, produce less heat, and cost less.

A number of approaches have been tried to minimize or overcome the above-identified problems. U.S. Pat. No. 4,042,890 to Eckerie filters the DC power signal to reduce high-frequency noise. U.S. Pat. No. 4,605,910 to Covill produces a switch modulated signal for producing an output signal that is independent of the supply voltage, thereby eliminating noise caused by fluctuating AC voltage signals. U.S. Pat. No. 4,737,731 to Swanson senses variations in the DC power signal and adjusts the gain in the audio frequency signal according to the variances to reduce modulation distortion. In U.S. Pat. No. 5,132,637 also to Swanson, a plurality of actuable power amplifiers are controlled by a correction signal to produce a cleaner signal. U.S. Pat. No. 5,777,519 to Simopoulos uses a correction signal as an input to a variable switching power supply to eliminate some noise in the power signal.

However, each of these methods share the problems of high cost, high heat loss, high weight, and overall inefficiency. A different method for regulating the power output that eliminates the regulated DC power source would offer significant advantages in cost and efficiency as well as a significant reduction in weight and increase in output power.

SUMMARY OF THE INVENTION

The present invention eliminates the need to regulate a DC power supply by regulating the gain of an amplifier in response to fluctuations and ripple in the unregulated DC power supply so that those fluctuations and ripples do not appear at the output power signal. Unregulated AC power may be supplied from a conventional AC outlet or from an isolation or other transformer. Unregulated AC power is first rectified into unregulated DC power, and this unregulated DC power signal is monitored by a voltage divider to establish a power supply "variance" signal. This variance signal is then squared by an analog multiplier. A second multiplier processes the signal from the first multiplier with a triangular wave signal to produce an input signal to an internal comparator. The first and second voltage multipliers comprise a triangular wave modulator. The resulting output signal from the second multiplier is the modulated triangular wave signal.

An internal comparator accepts an input audio or other signal as well as the output signal from the second multiplier. This internal comparator monitors and processes the input audio signal with the modulated triangular wave signal to generate a Pulse Width Modulation (PWM) output signal. From the internal comparator, the PWM output signal is amplified by a power transistor device, and the amplified PWM signal passes through filters to remove a high-frequency carrier component. The signal output from the filters is an amplified audio signal, which is then used to drive a load device.

The variances in the power supply voltage are demodulated or removed by this approach, thereby eliminating the need for a regulated DC power supply. The invention provides for dynamic adjustment for noise in the unregulated DC power supply, resulting in a simpler and more efficient power amplifier to derive a clean, regulated, amplified power drive signal. The present invention also provides audio improvements including compression and frequency equalization.

BRIEF DESCRIPTION OF THE DRAWINGS

The objects and features of the invention will become more readily understood from the following detailed description and appended claims when read in conjunction with the accompanying drawings in which like numerals represent like elements.

DETAILED DESCRIPTION OF THE PREFERRED EMBODIMENTS

In the following Detailed Description of the Preferred Embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention. For example, intervening electrical components may be located along electrical connections, and electrical components of different ratings may be used, without departing from the scope of the present invention. Moreover, persons of ordinary skill in the art will know that numerous minor alternatives to a specific circuit design are possible, without departing from the scope of the present invention. Thus understood, the details of the circuit provided, including the ratings of the electrical components in the specific preferred embodiments, are not intended to limit the scope of any claim, nor to be read into any claim, but merely to provide an example of a fully enabled and disclosed best mode of practicing a preferred embodiment of the invention.

Figure 1:
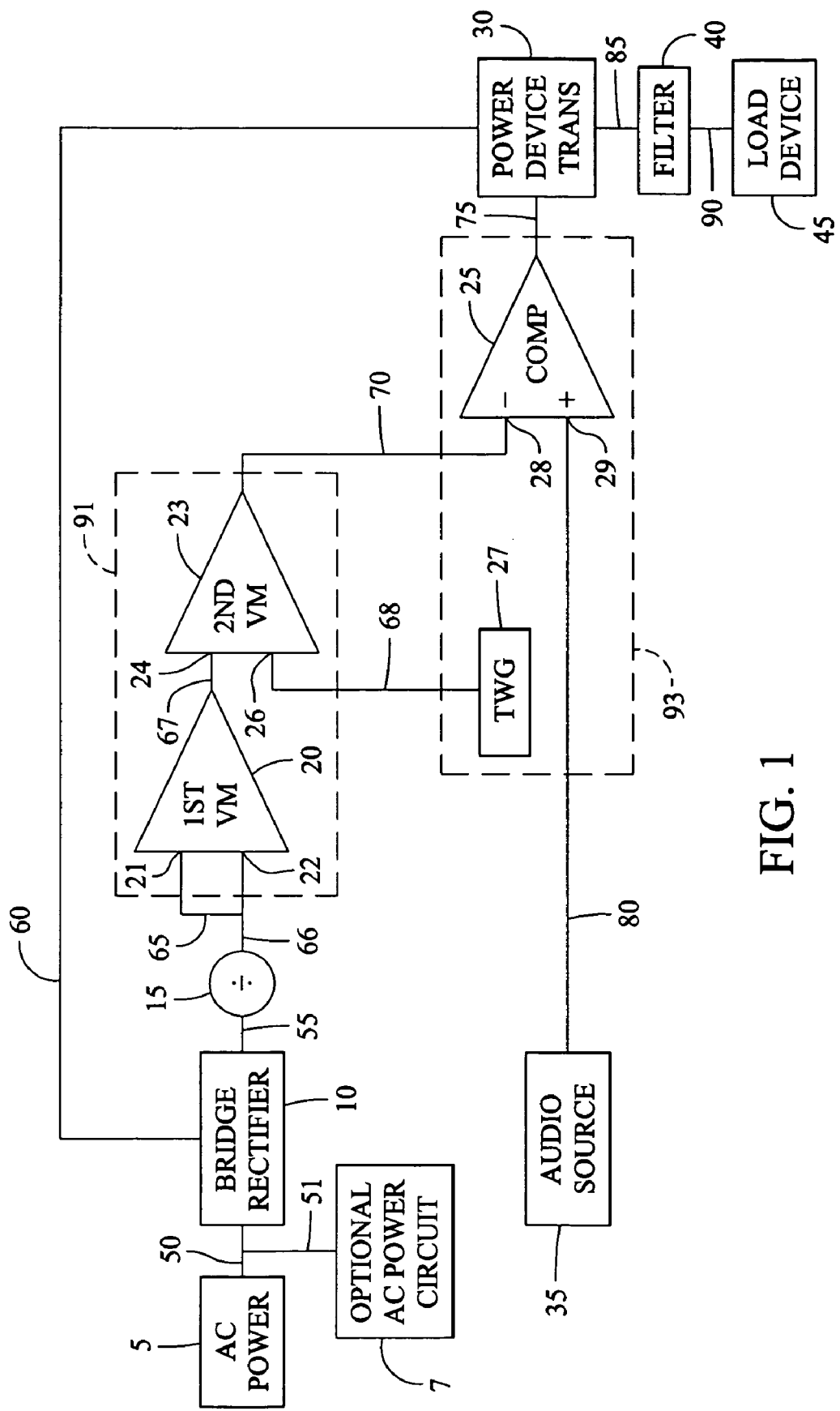
FIG. 1 is a basic circuit block diagram illustrating a preferred embodiment of the functional components of the power amplifier of the present invention.

FIG. 1 illustrates a preferred embodiment of the basic electrical components of the amplifier of the present invention. As seen in FIG. 1, an AC power supply 5 is coupled to an optional AC power circuit (transformer) 7 by an electrical connection 50. Optional AC power circuit 7 is coupled to a bridge rectifier 10 by an electrical connection 51. Bridge rectifier 10 is coupled to a voltage divider 15 by an electrical connection 55. Bridge rectifier 10 is also coupled to a power transistor device 30 by an electrical connection 60.

Voltage divider 15 is coupled to a first input 21 of a first voltage multiplier 20 by an electrical connection 65 and to a second input 22 by an electrical connection 66. The output of first voltage multiplier 20 is coupled to a first input 24 of a second voltage multiplier 23 by an electrical connection 67. A triangular wave generator 27 is coupled to a second input 26 of second voltage multiplier 23 by electrical connection 68. First voltage multiplier 20 and second voltage multiplier 23 comprise a triangular wave modulator (TWM) 91.

The output of second voltage multiplier 23 is coupled to a first input 28 of an internal comparator 25 by an electrical connection 70. In a preferred embodiment, an audio signal source 35 is coupled to a second input 29 of an internal comparator 25 by an electrical connection 80. The output of internal comparator 25 is coupled to a power transistor device 30 by an electrical connection 75. In the preferred embodiment, internal comparator 25 is internal of a pulse width modulation controller integrated circuit (PWM controller 93) that includes triangular wave generator 27, as described in detail below. Power transistor device 30 is coupled to a filter 40 by an electrical connection 85. Filter 40 is coupled to a load device 45 by an electrical connection 90.

In operation, unregulated AC power supply 5 supplies an unregulated, AC power signal to the amplifier. The unregulated AC power signal passes through bridge rectifier 10, which rectifies, or converts, the unregulated AC power signal into an unregulated DC power signal. This unregulated DC power signal is used to provide a reference voltage to triangle wave modulator 91 as well as being used by power transistor device 30 to power load device 45.

From bridge rectifier 10, the unregulated DC power signal passes through voltage divider 15. Voltage divider 15 establishes a unity voltage level and provides two input power signals comprising the voltage variance of the power signal into first voltage multiplier 20. First voltage multiplier 20 multiplies these two signals together, providing an unregulated DC power signal equal to the square of the voltage variance.

The output of first voltage multiplier 20 is coupled to first input 24 of second voltage multiplier 23. Triangular wave generator 27 generates a triangular wave signal that is coupled to second input 26 of second voltage multiplier 23. These two signals are multiplied together by second voltage multiplier 23 to generate a modulated triangular wave signal.

The modulated triangular wave signal, output from triangular wave modulator 91, is the first input to comparator 25. The second input to comparator 25 is the audio signal being amplified, from audio source 35. Comparator 25 compares the modulated triangular wave signal and the audio signal to generate a pulse width modulation (PWM) power signal carrying the audio component. The PWM power signal then passes to power transistor device 30, which amplify the PWM power signal. This amplified PWM power signal then passes through filter 40 (e.g., an inductance capacitor filter) which filters out the high-frequency carrier component of the PWM power signal. This filtered PWM power signal provides a clean, undistorted audio signal free of noise to load device 45 because the modulated triangle wave signal compensates for variances in AC power supply 5, powering the load device 45 for the relevant application.

Figure 2:
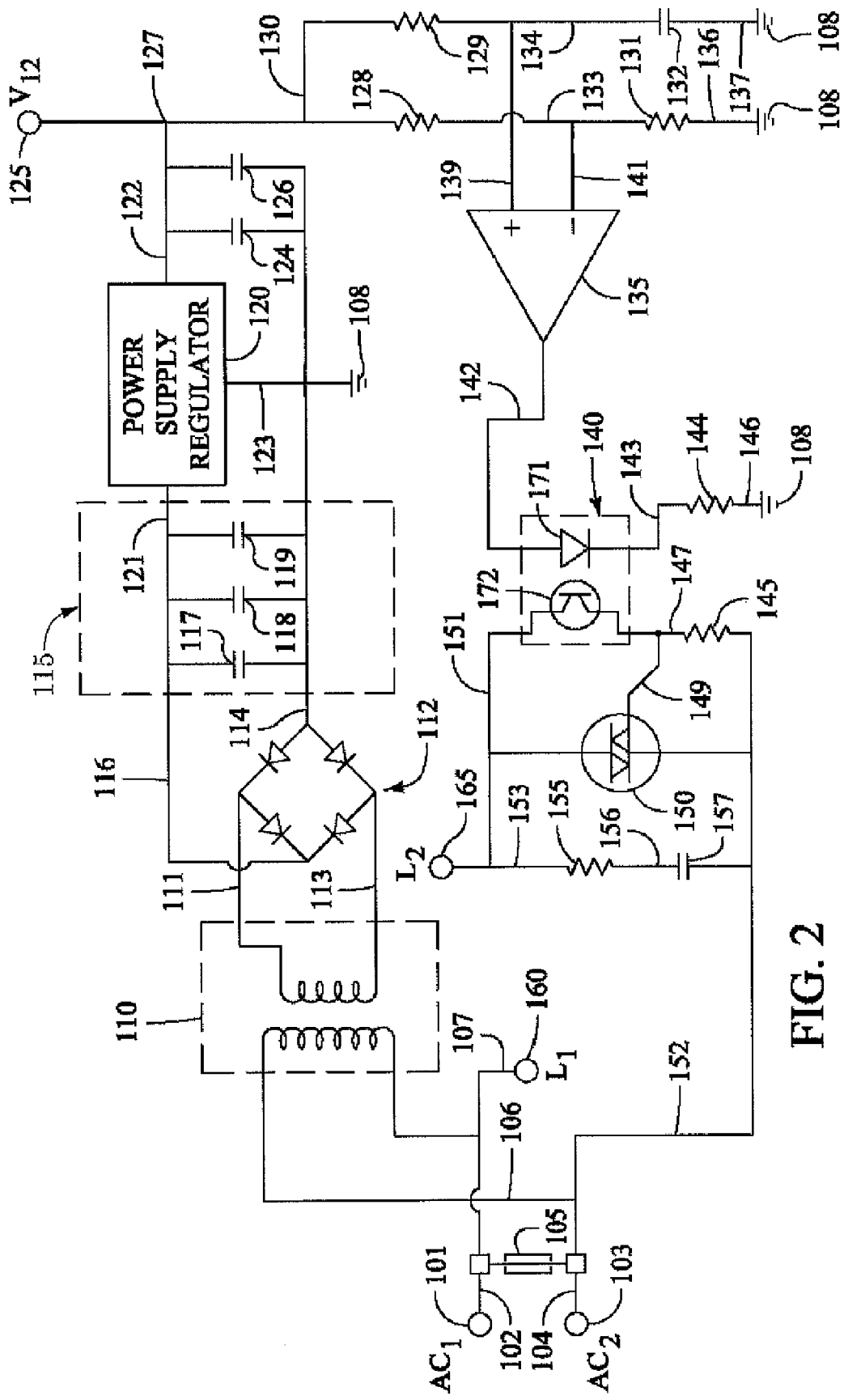
FIG. 2 is a circuit schematic of a preferred embodiment of the AC power circuit.

FIG. 2 illustrates a preferred embodiment for the AC power circuit (7 in FIG. 1) of the present invention. In this embodiment, the AC power circuit uses a triac 150 and optocoupler 140 to delay the onset of AC power in the amplifier. This time delay power-on circuit delays the onset of AC power to allow the control circuit to stabilize and avoid loud pops when switched on.

In the circuit, AC power from an outside AC power source (e.g., wall outlet, generator, etc.) is provided through an electrical pole 101 and an electrical pole 103. Electrical poles 101 and 103 are coupled respectively by an electrical connection 102 and an electrical connection 104 in a parallel electrical circuit with a two-pole circuit breaker 105. Electrical connection 102 is coupled from circuit breaker 105 to a transformer 110 (e.g., 12-volt transformer). Electrical connection 104 is also coupled from circuit breaker 105 to transformer 110.

Transformer 110 steps down the supply voltage (e.g., from 120-volts AC to 12-volts AC). Current flows from transformer 110 through two electrical connections 111 and 113 to a bridge rectifier 112. The output from bridge rectifier 112 passes through electrical connections 116 and 114 to a filter network 115. In a specific preferred embodiment, filter network 115 comprises a 2200 µF capacitor 117, a 100 µF capacitor 118, and a 0.1 µF capacitor 119 coupled in parallel with bridge rectifier 112 by electrical connections 116 and 114.

An electrical connection 121 couples a power supply regulator 120 to electrical connection 116. In a specific preferred embodiment, power supply regulator 120 is of the type comparable to a Motorola 78L12. Power supply regulator 120 is coupled to an electrical ground 108 by an electrical connection 123. A capacitor 124 and a capacitor 126 are coupled to power supply regulator 120 by an electrical connection 122. The two capacitors 124 and 126 are also coupled together and to ground by electrical connection 114.

An electrical connection 127 couples a resistor 128 to a terminal $V_{12}$ 125. Terminal $V_{12}$ 125 represents a source of direct current (DC) power supplied for the circuit. In the preferred embodiment disclosed, the voltage supplied is for a 12-volt circuit. Also in the preferred embodiment disclosed, resistor 128 is a 68K-ohm resistor. A resistor 129 is coupled to electrical connection 127 by an electrical connection 130 in a parallel electric circuit configuration.

As stated, terminal $V_{12}$ 125 is coupled to electrical connection 127, and this electric terminal $V_{12}$ 125 provides a DC power source (e.g., 12-volt). Resistor 128 and resistor 129 are both coupled to the DC power source. Resistor 128 is coupled in series with another resistor 131 by electrical connection 133. In a specific preferred embodiment, resistor 131 is a 68K-ohm resistor. Resistor 129 is coupled in series with a capacitor 132 by an electrical connection 134. Resistor 131 is coupled to an electrical ground 108 by an electrical connection 136, and capacitor 132 is coupled to an electrical ground 108 by an electrical connection 137.

A comparator 135 is coupled to electrical connections 133 and 134. The non-inverting input to comparator 135 is coupled to electrical connection 134 by an electrical connection 139. The inverting input of comparator 135 is coupled to electrical connection 133 by an electrical connection 141. Comparator 135 compares the input voltages of the two electrical connections. If the voltage at electrical connection 139 is less than the voltage at electrical connection 141, the output of comparator 135 will be low, with the voltage at the output at an electrical connection 142 at the lowest possible value (e.g., digital output=0). If the voltage at electrical connection 139 is greater than the voltage at electrical connection 141, the output of comparator 135 will be high, with the voltage at the output at electrical connection 142 at its highest value (e.g., digital output=1).

An optocoupler 140 is comprised of a light emitting diode (LED) 171 and a phototransistor 172 inside a component case. Light emitting diode 171 emits light when the digital output value from comparator 135 equals 1 (e.g., the voltage at electrical connection 139 is greater than that at electrical connection 141). An electrical connection 143 couples a resistor 144 to the LED 171. An electrical connection 146 couples resistor 144 to ground 108. In a specific preferred embodiment, resistor 144 is a 560K-ohm resistor.

Phototransistor 172 has a light sensitive base region. When light strikes the photosensitive base of phototransistor 172, the emitter-to-collector resistance falls, allowing current to flow through phototransistor 172. When the digital output value from comparator 135 equals 1 (logic 1 state), LED 171 is illuminated. Light from LED 171 charges the base of phototransistor 172, permitting current flow through phototransistor 172. Thus, optocoupler 140 functions as a switch triggered by the output of comparator 135.

An electrical connection 152 couples circuit breaker 105 and the AC power to a capacitor 157, a triode alternating current switch (triac) 150, and a resistor 145. Resistor 145 is coupled to optocoupler 140 by an electrical connection 147. An electrical connection 149 further couples electrical connection 147 to the gate of triac 150. Triac 150 is coupled to a terminal $L_2$ 165 and optocoupler 140 by an electrical connection 151. Capacitor 157 is coupled to a resistor 155 by an electrical connection 156, and resistor 155 is further coupled to terminal $L_2$ 165 by an electrical connection 153. Terminal $L_1$ 160 is coupled to transformer 110 and breaker 105 by electrical connection 107.

Optocoupler 140 isolates triac 150 from the control circuit. When phototransistor 172 is activated by LED 171, voltage applied to the gate of triac 150 causes current to flow through triac 150 and energize terminal $L_2$ 165. Once the gate activates triac 150, AC power will continue to terminal $L_2$ 165 and $L_1$ 160 as long as the circuit remains energized. The optocoupler 140 and triac 150 combination will delay circuit power-up until the control circuit stabilizes, avoiding pops and hiss from the audio output.

Figure 3:
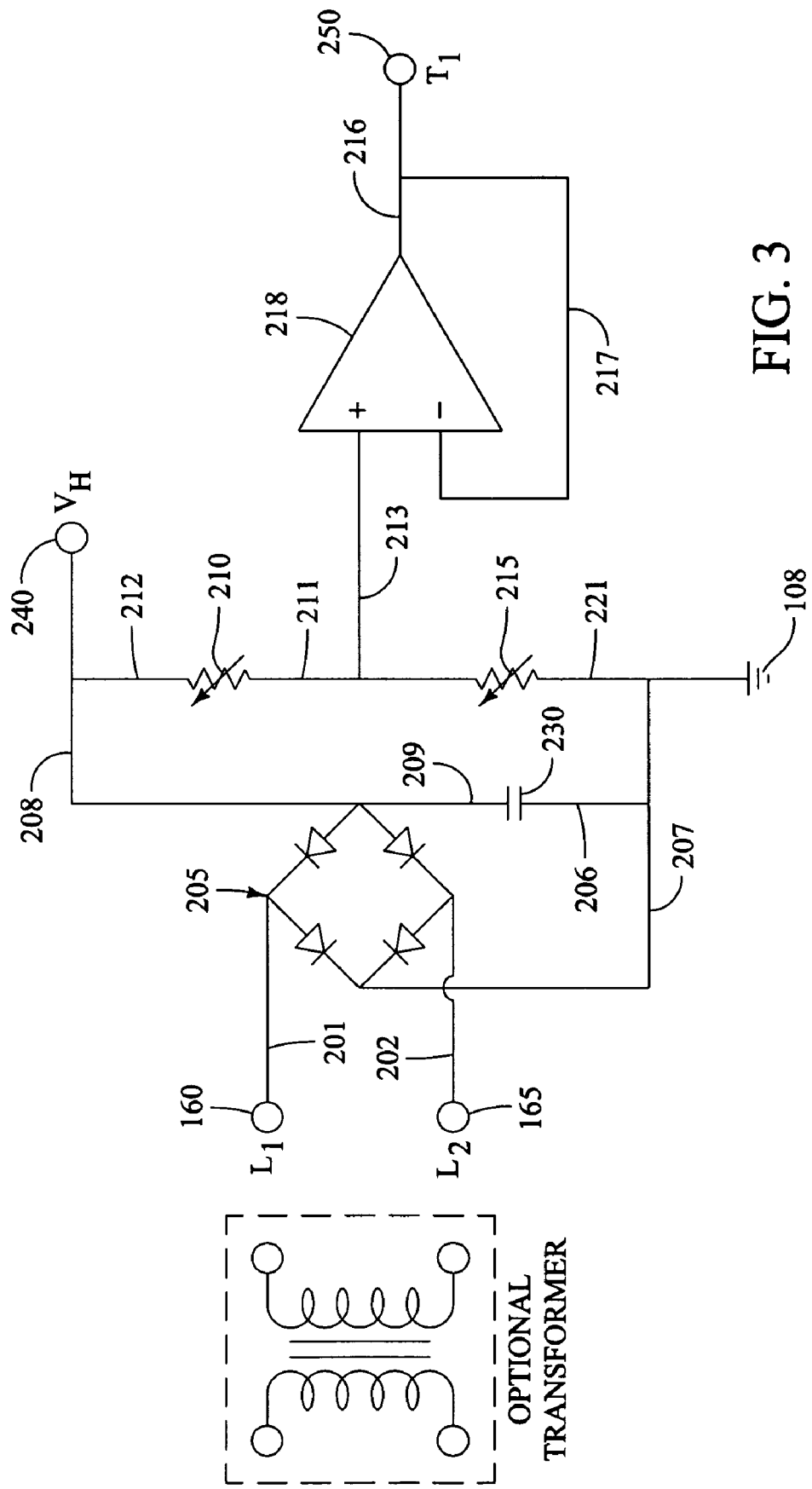
FIG. 3 is the circuit schematic of a preferred embodiment of the DC bridge rectifier and voltage divider.

FIG. 3 illustrates a preferred embodiment of a bridge rectifier 205 (10 in FIG. 1) and a voltage divider (resistors 210, 215, and their electrical interconnection, 15 in FIG. 1) of the present invention. A pair of terminals $L_1$ 160 and $L_2$ 165 are coupled to bridge rectifier 205 by electrical connections 201 and 202 respectively. Two electrical output connections from bridge rectifier 205 couple to a resistor-capacitor (RC) filter and resistor voltage divider network arrangement. An electrical connection 208 couples bridge rectifier 205 to terminal $V_H$ 240. Terminal $V_H$ 240 represents a high voltage terminal connection. An electrical connection 207 couples bridge rectifier 205 to an electrical connection 221, and to an electrical connection 206. Electrical connection 221 is coupled to ground 108. An electrical connection 209 couples bridge rectifier 205 to a capacitor 230. In a specific preferred embodiment, capacitor 230 is a 1000 µF capacitor. Electrical connection 206 couples capacitor 230 to electrical connection 207. Electrical connection 209 is also coupled to electrical connection 208.

A resistor 210 and a resistor 215 are connected in series to each other and to capacitor 230 in a parallel circuit. An electrical connection 212 couples resistor 210 to electrical connection 208. An electrical connection 211 further couples resistor 210 to resistor 215. Electrical connection 221 couples resistor 215 to ground 108.

An electrical connection 213 couples resistors 210 and 215 to the non-inverting terminal of an operational amplifier 218 (op amp 218). An electrical connection 217 couples the output of op amp 218 to the inverting terminal input of op amp 218. Thus configured op amp 218 performs as a voltage follower. An electrical connection 216 connects the output of op amp 218 (the voltage follower) to a terminal $T_1$ 250. The arrangement of the resistors 210 and 215 and the electrical connections 213 and 211 between resistors 210 and 215 comprises a resistor voltage divider network. One or both of resistors 210 and 215 may be variable, to accommodate adjustment of the power variance signal.

Figure 4:
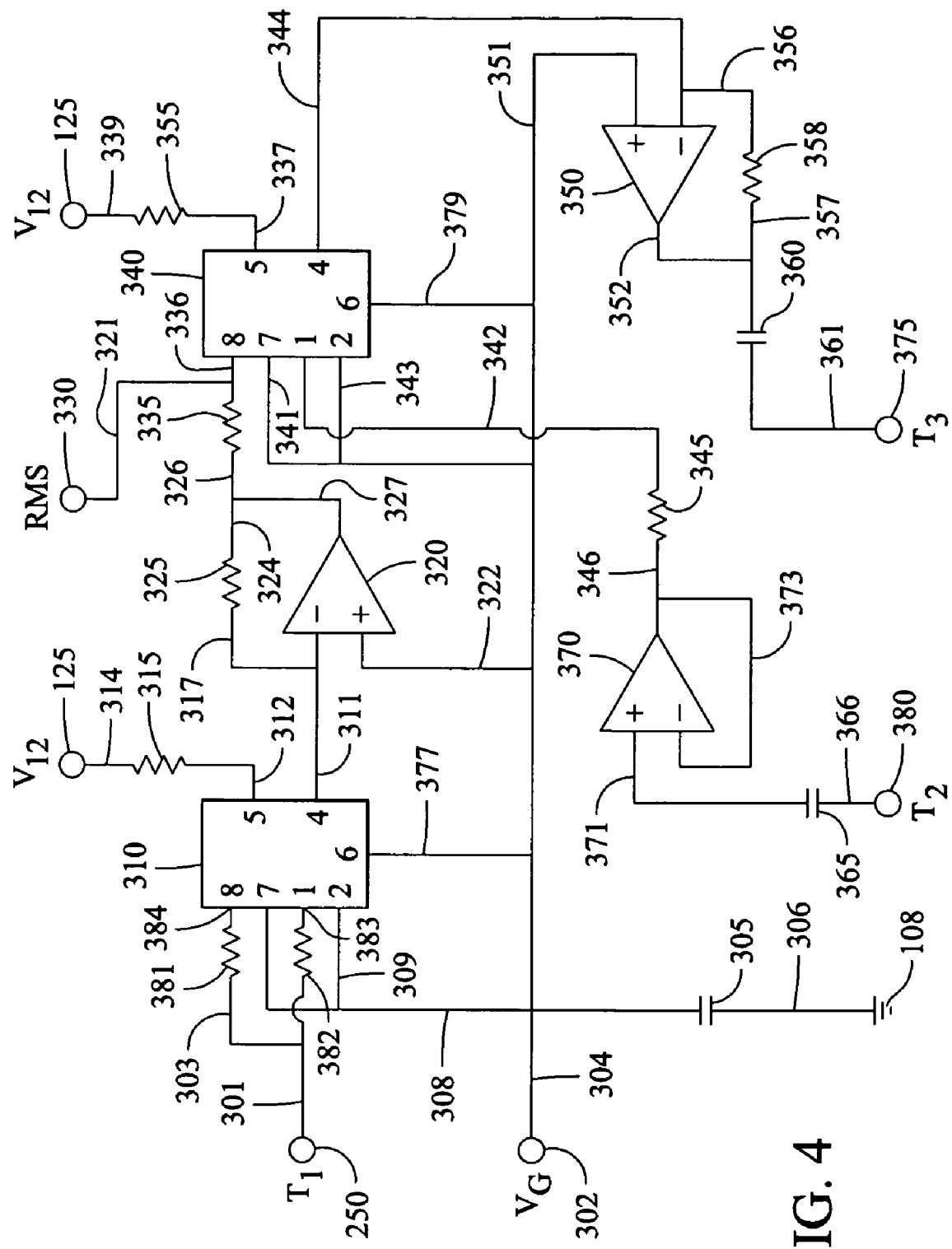
FIG. 4 is a circuit schematic of a preferred embodiment of the triangular wave modulator (TWM) containing two voltage multipliers.

FIG. 4 illustrates a preferred embodiment of the circuit for the triangular wave modulator (91 in FIG. 1) of the present invention. Although the preferred embodiment shown in FIG. 4 discloses a design for an analog circuit, the equivalent functionality may be achieved through digital circuitry, such as, for example, by use of digital signal processors.

As seen in FIG. 4, a terminal $T_1$ 250 is coupled to a first resistor 382 by an electrical connection 301. Resistor 382 is subsequently coupled to a first voltage multiplier 310 (20 in FIG. 1), an integrated circuit chip with a voltage multiplier circuit, by an electrical connection 383 to pin 1. Terminal $T_1$ 250 is coupled to a second resistor 381 by electrical connection 301 through an electrical connection 303. Resistor 381 is subsequently coupled to first voltage multiplier 310 by an electrical connection 384 to pin 8. Pin 7 of voltage multiplier 310 is coupled to a capacitor 305 (typically 0.1 μF) by an electrical connection 308. Pin 2 of first voltage multiplier 310 is coupled to electrical connection 308 by an electrical connection 309.

Capacitor 305 is coupled to ground 108 by an electrical connection 306. Terminal $V_G$ 302 is coupled to electrical connection 308 by an electrical connection 304. Terminal $V_G$ 302 represents a virtual ground for supplying a ground reference to single power supply electrical components. Pin 5 of first voltage multiplier 310 is coupled to a resistor 315 by an electrical connection 312, and resistor 315 is coupled to a terminal $V_{12}$ 125 by an electrical connection 314. In a specific preferred embodiment, resistor 315 is 60K-ohm resistor. Pin 6 of first voltage multiplier 310 is coupled to terminal $V_G$ 302 by electrical connection 377.

Pin 4 of first voltage multiplier 310 is coupled to the inverting input of an op amp 320 by an electrical connection 311. A resistor 325 is coupled to the inverting input of op amp 320 by an electrical connection 317, which is coupled to electrical connection 311. An electrical connection 321 couples an RMS terminal 330 to the pin 8 input of a second voltage multiplier 340 (23 FIG. 1) through an electrical connection 336. An electrical connection 324 couples resistor 325 to the output of op amp 320 through an electrical connection 327. An electrical connection 326 couples a resistor 335 to electrical connection 324.

Electrical connection 336 couples resistor 335 to pin 8 of second voltage multiplier 340. This signal input is the square of the variance of the input voltage to first voltage multiplier 310. The signal from RMS terminal 330 is added to this signal. The second input is from a triangular wave generator through pin 1 of second voltage multiplier 340. Pin 7 of second voltage multiplier 340 is coupled to an electrical connection 351 by electrical connection 341. Pin 2 of second voltage multiplier 340 is coupled to electrical connection 341 by an electrical connection 343.

Pin 5 of second voltage multiplier 340 is coupled to a resistor 355 by an electrical connection 337. Resistor 355 is further coupled to a terminal $V_{12}$ 125 by an electrical connection 339. In a specific preferred embodiment, resistor 355 is a 60K-ohm resistor. Pin 6 of second voltage multiplier 340 is connected to $V_G$ 302 by an electrical connection 379 which is coupled to electrical connection 351.

Pin 4 of second voltage multiplier 340 is the output of the two voltage multipliers. This output is connected to an inverter amplifier circuit, comprising an op amp 350 and resistor 358. Pin 4 of second voltage multiplier 340 is coupled to the inverting input of op amp 350 by an electrical connection 344. Electrical connection 356 couples resistor 358 to electrical connection 344. The output of op amp 350 is coupled to electrical connection 357, which couples resistor 358 to capacitor 360 by connection 352. Capacitor 360 is coupled to terminal $T_3$ 375 by electrical connection 361.

Pin 1 of second voltage multiplier 340 receives the input triangular wave signal. Terminal $T_2$ 380 is coupled to a capacitor 365 by electrical connection 366. In a specific preferred embodiment, capacitor 365 is a 0.047 μF capacitor. Capacitor 365 is coupled to the non-inverting input of a voltage follower op amp 370 by an electrical connection 371. The output of op amp 370 is coupled to a resistor 345 by an electrical connection 346. In a specific preferred embodiment, resistor 345 is a 10K-ohm resistor. Electrical connection 346 is coupled to the inverting input of voltage follower op amp 370 by an electrical connection 373. Resistor 345 is coupled to pin 1 of second voltage multiplier 340 by an electrical connection 342.

Figure 5:
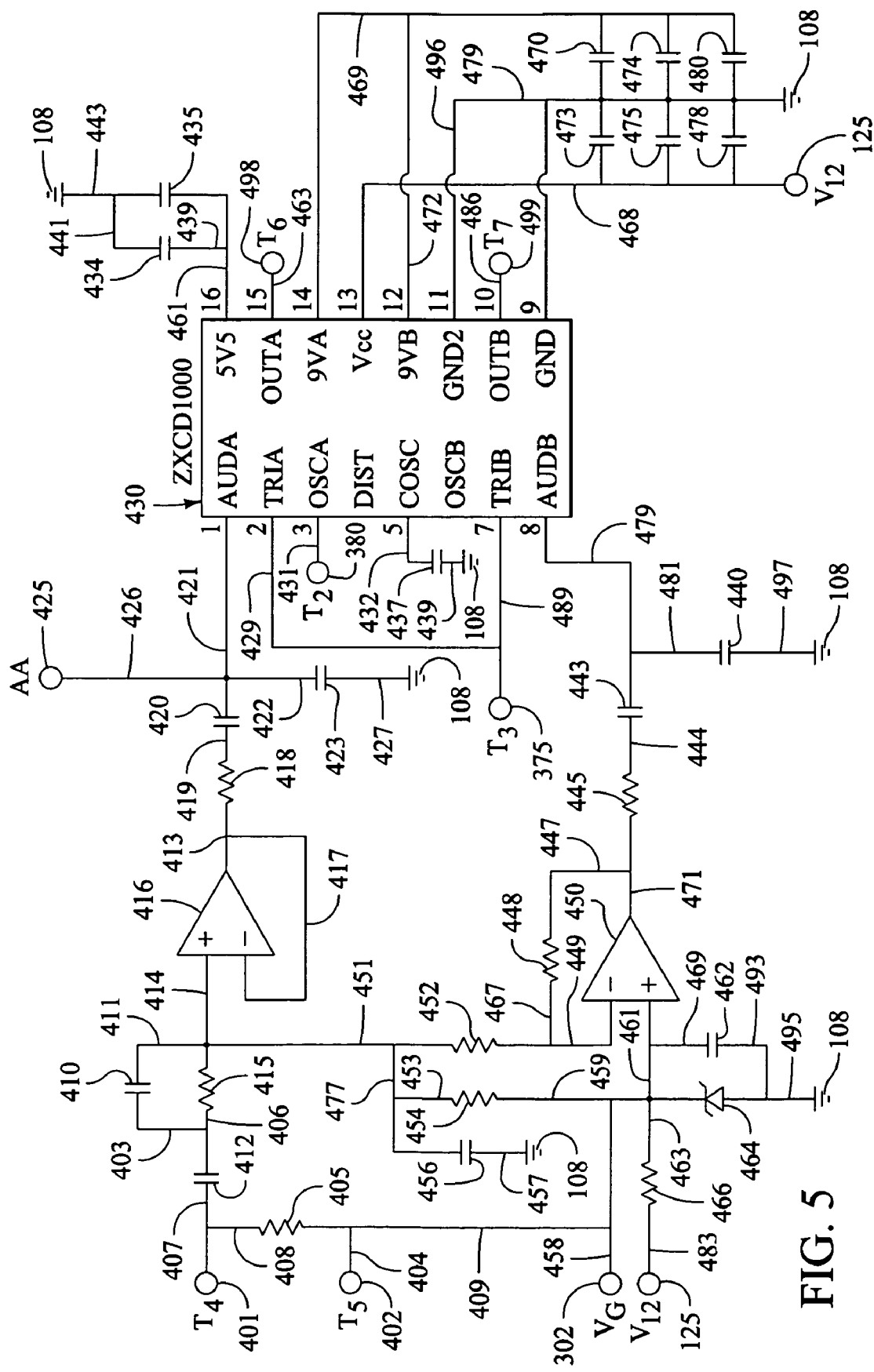
FIG. 5 is a circuit schematic of a preferred embodiment of the pulse width modulator (PWM) controller containing the triangular wave generator and pulse width modulation amplifier.

FIG. 5 illustrates a preferred embodiment of the present invention for the pulse width modulation controller (93 in FIG. 1) including its audio input circuitry, the triangular wave generator, and the pulse width modulation amplifier. The audio source signal input to the amplifier is through terminals $T_4$ 401 and $T_5$ 402. Terminal $T_4$ 401 is coupled to a capacitor 412 by an electrical connection 407. In a specific preferred embodiment, capacitor 412 is a 22 μF capacitor. A resistor 405 is coupled to electrical connection 407 by an electrical connection 408. In a specific preferred embodiment, resistor 405 is a 100K-ohm resistor. Resistor 405 is coupled to a terminal $V_G$ 302 by an electrical connection 409, and terminal $T_5$ 402 is coupled to electrical connection 409 by an electrical connection 404.

Capacitor 412 is coupled to a resistor 415 by an electrical connection 406. In a specific preferred embodiment, resistor 415 is an 11K-ohm resistor. A capacitor 410 is coupled to electrical connection 406 by an electrical connection 403. In a specific preferred embodiment, capacitor 410 is a 0.1 μF capacitor 410. Resistor 415 is coupled to the non-inverting terminal of an op amp 416 by an electrical connection 414. Capacitor 410 is connected in a parallel circuit to resistor 415 by an electrical connection 411 connected to electrical connection 414.

Op amp 416 is configured as a follower. Electrical connection 414 is coupled to the non-inverting input of op amp 416. The output of the op amp 416 is coupled to a resistor 418 by an electrical connection 413. In a specific preferred embodiment, resistor 418 is a 390-ohm resistor. An electrical connection 417 couples electrical connection 413 to the inverting input of op amp 416, thus configuring op amp 416 as a voltage follower. Resistor 418 is coupled to a capacitor 420 by an electrical connection 419. In a specific preferred embodiment, capacitor 420 is a 22 μF capacitor. Capacitor 420 is coupled to a pulse width modulation controller 430 (93 in FIG. 1).

In the preferred embodiment disclosed, PWM controller 430 is an integrated circuit chip, which provides the triangular wave generator and internal comparator circuit. An electrical connection 421 is connected to PIN 1 (AUDA) of PWM controller 430. A terminal AA 425 is coupled to electrical connection 421 by an electrical connection 426. Terminal AA 425 represents the audio input to the circuit. In the preferred embodiment, the audio input is buffered as shown by voltage follower 416. A capacitor 423 is coupled to electrical connection 421 by an electrical connection 422, and the capacitor 423 is coupled to ground 108 by an electrical connection 427. In a specific preferred embodiment, capacitor 423 is a 6800-pF capacitor.

An electrical connection 451 couples the audio input signal to an inverting amplifier 450. Electrical connection 451 is coupled to a resistor 452. An electrical connection 449 couples resistor 452 to the inverting input of op amp 450. An electrical connection 467 couples electrical connection 449 to another resistor 448. In a specific preferred embodiment, resistor 452 and resistor 448 are 22K-ohm resistors.

A capacitor 456 is coupled to electrical connection 451 by an electrical connection 477. Capacitor 456 is coupled to ground 108 by an electrical connection 457. In a specific preferred embodiment, capacitor 456 is a 47-pF capacitor. A resistor 454 is coupled to electrical connection 477 by an electrical connection 453, in a parallel circuit arrangement with capacitor 456. An electrical connection 459 couples resistor 454 to connection 458, thence to Terminal $V_G$ 302.

Terminal $V_G$ 302 is coupled to electrical connection 459 by an electrical connection 458. An electrical connection 461 couples electrical connection 459 to the non-inverting input of op amp 450. A capacitor 462 is coupled to electrical connection 461 by an electrical connection 469, and electrical connection 493 couples capacitor 462 to electrical connection 495 and ground 108.

The output of the op amp 450 is coupled to a resistor 445 by an electrical connection 471. In a specific preferred embodiment, resistor 445 is a 390-ohm resistor. Resistor 445 is coupled to a capacitor 443 by an electrical connection 444. In a specific preferred embodiment, capacitor 443 is a 22-μF capacitor. An electrical connection 479 couples capacitor 443 to pin 8, the Audio B (AUD B) input, on controller 430. An electrical connection 481 couples electrical connection 479 to a capacitor 440, and electrical connection 497 couples capacitor 440 to ground 108. In a specific preferred embodiment, capacitor 440 is a 6800-pF capacitor 6800.

Figure 9:
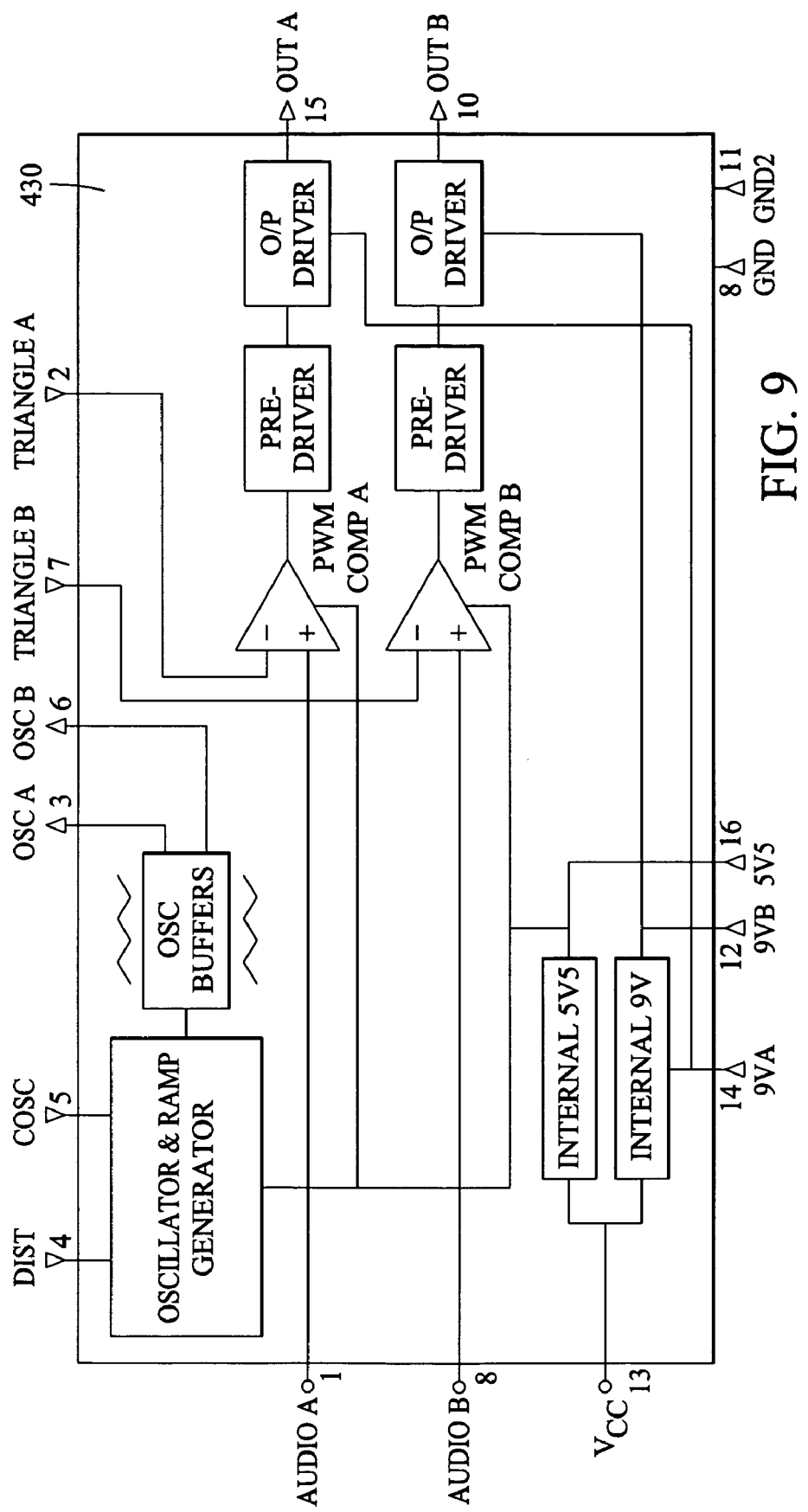
FIG. 9 illustrates the internal operative connectivity for the PWM controller illustrated schematically and described in detail in connection with FIG. 5.

In a specific preferred embodiment, pulse width modulation controller 430 is a Zetex ZXCD 1000, the internal configuration of which is illustrated in FIG. 9. In this embodiment, electrical connection 421 is coupled to pin 1 of PWM controller 430. Pin 1 is the Audio A (AUD A) input, which is the non-inverting input to the first internal comparator on controller 430. The Audio B (AUD B) input, pin 8, is coupled to op amp 450 by electrical connection 479. AUD B is the non-inverting input to the second internal comparator on controller 430. A terminal $T_3$ 375, the output from second voltage multiplier 340, is coupled to the Triangle B (TRI B) input, pin 7, of PWM controller 430 by electrical connection 489. Electrical connection 429 couples electrical connection 489, and terminal $T_3$ 375, to Triangle A (TRI A) input, pin 2 of PWM controller 430.

PWM controller 430 includes two internal comparators (see FIG. 9). The AUD A input, pin 1 of PWM controller 430, is coupled to the non-inverting input of the first internal comparator, and the TRI A input, pin 2 of PWM controller 430, is the inverting input of the first internal comparator. The Output A (OUT A), pin 15 of PWM controller 430, is the output signal from the first internal comparator and is coupled to terminal $T_6$ 498 by an electrical connection 463. The AUD B input, pin 8 on PWM controller 430, is the non-inverting input of the second internal comparator, and the TRI B input, pin 7 of PWM controller 430, is the inverting input of the second internal comparator. The Output B (OUT B), pin 10 of PWM controller 430, is the output signal from the second internal comparator and is coupled to terminal $T_7$ 499 by an electrical connection 486.

PWM controller 430 also generates the triangular wave signal input to second voltage multiplier 340. OSC A generates a triangular wave signal. The OSC A output, pin 3, is coupled to terminal $T_2$ 380 by electrical connection 431. Referring back to FIG. 4, it is seen that the triangular wave signal at terminal $T_2$ 380 subsequently passes through capacitor 365, follower 370, and resistor 345, to the pin 1 input of second voltage multiplier 340. Referring again to FIG. 5, pin 5 of PWM controller 430, COSC, is coupled to a capacitor 437 by electrical connection 432, and capacitor 437 is coupled to ground 108 by electrical connection 439. In a specific preferred embodiment, capacitor 437 is a 330-μF capacitor. Pin 9 of PWM controller 430, GND, is coupled to ground 108 by electrical connection 479. Pin 11 of PWM controller 430, GND2, is coupled to electrical connection 479 and ground 108 by an electrical connection 496.

Pin 12 of PWM controller 430, 9VB, is connected to an internal power supply of PWM controller 430 (typically 9-volt), and is coupled by an electrical connection 472 to three capacitors 470, 474, and 480, which are individually connected in a bridge, or parallel arrangement to electrical connection 479. Pin 14 of the PWM controller 430, 9VA, is connected to the internal power supply of PWM controller 430 (typically 9-volt), and is coupled by an electrical connection 469 to electrical connection 472 and the three capacitors 470, 474, and 480. Pin 16 of the PWM controller 430, 5V5, is connected to an internal power supply of PWM controller 430 (typically 5.5-volt), and is coupled to a capacitor 435 by an electrical connection 461. Capacitor 435 is coupled to ground 108 by an electrical connection 443. An electrical connection 439 couples a capacitor 434 to electrical connection 461 and to 5V5. An electrical connection 441 couples capacitor 434 to ground 108.

Pin 13, $V_{CC}$, receives the external power supply to PWM controller 430. Pin 13, $V_{CC}$ is coupled to the power supply terminal $V_{12}$ 125 (12-volt in the specific preferred embodiment), by electrical connection 468, and is coupled by three capacitors 473, 475, and 478 in a bridge, or parallel circuit arrangement, to electrical connection 479 and ground 108. The external power supply $V_{CC}$ supplies power to PWM controller 430, and regulators on PWM controller 430 drop the power to the internal power sources (typically 9-volt and 5.5-volt) required by the internal circuitry of PWM controller 430.

Figure 6:
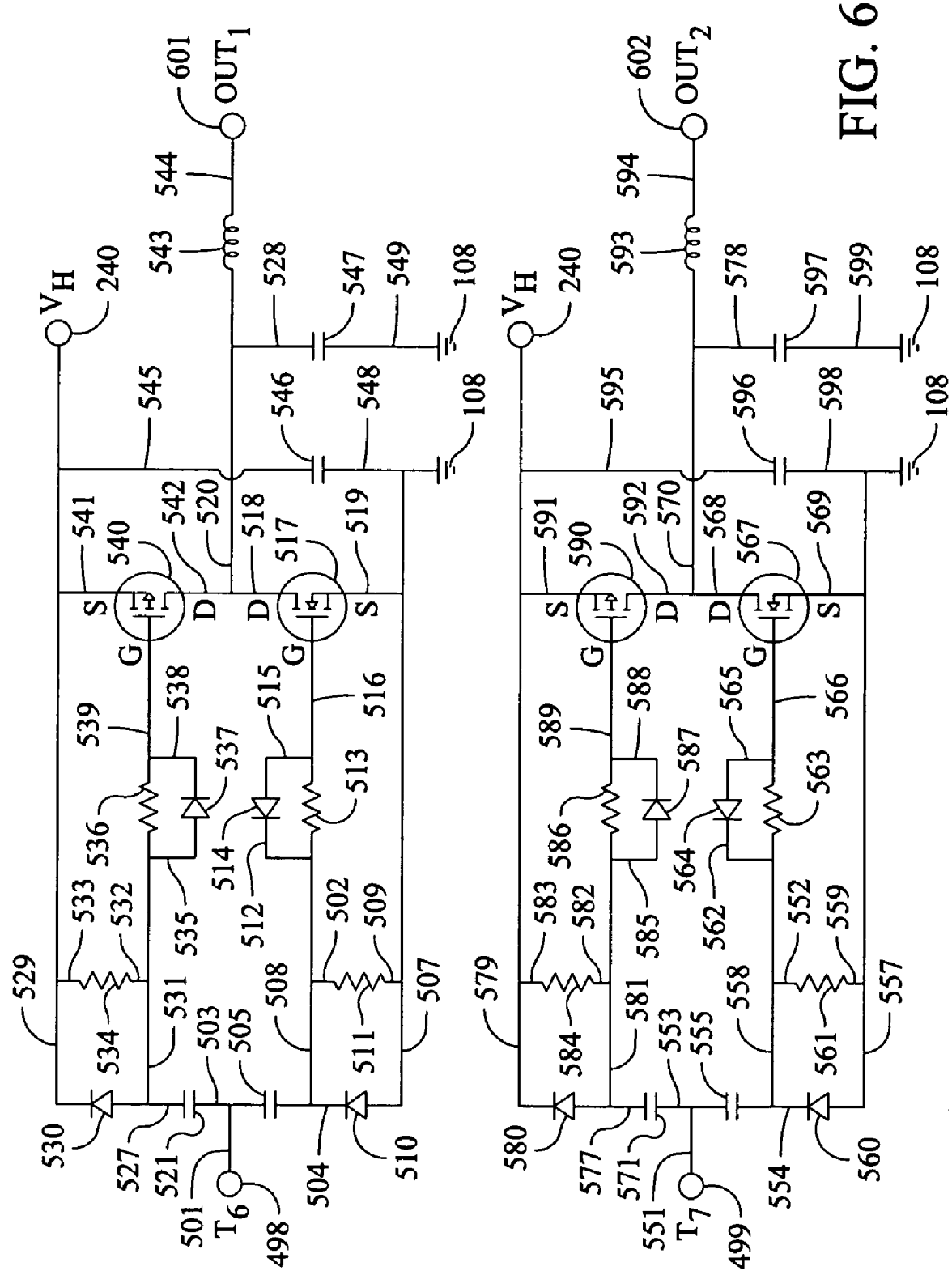
FIG. 6 is the circuit schematic of a preferred embodiment of the power transistor device and filter.

FIG. 6 illustrates a preferred embodiment for the power transistor device and filter (30 and 40 in FIG. 1) of the present invention. A terminal $T_6$ 498 is coupled by an electrical connection 501 to an electrical connection 503. Electrical connection 503 couples a capacitor 521 to a capacitor 505 in series. An electrical connection 527 couples capacitor 521 to the anode of diode 530. An electrical connection 529 couples the cathode of diode 530 to a terminal $V_H$ 213. An electrical connection 533 couples a resistor 534 to electrical connection 529 and to the cathode of diode 530 in a parallel circuit. An electrical connection 531 couples electrical connection 527 and an electrical connection 532 to resistor 536. An electrical connection 535 couples electrical connection 531 to the anode of a diode 537 in a parallel circuit to a resistor 536. Cathode of diode 537 is coupled to electrical connection 539 by an electrical connection 538.

An electrical connection 545 couples a capacitor 546 to electrical connection 529 and terminal $V_H$ 213 and the cathode of diode 530. In a specific preferred embodiment, capacitor 546 is a 0.47-μF capacitor. An electrical connection 548 couples capacitor 546 to ground 108.

Electrical connection 539 couples resistor 536 and electrical connection 538 to the gate of a P-channel metal-oxide-semi-conductor field-effect transistor (MOSFET) 540. The source of MOSFET 540 is coupled to electrical connection 529 by an electrical connection 541. The drain of MOSFET 540 is connected to an electrical connection 520 by an electrical connection 542.

Capacitor 505 is coupled to the cathode of a diode 510 by an electrical connection 504. An electrical connection 508 couples electrical connection 504 to a resistor 513. An electrical connection 502 couples electrical connection 508 to a resistor 511 in a parallel circuit to diode 510. An electrical connection 509 couples resistor 511 to an electrical connection 507. An electrical connection 512 couples the cathode of a diode 514 to electrical connection 502 in a parallel circuit to resistor 513. An electrical connection 515 couples the anode of diode 514 to an electrical connection 516, which is coupled to resistor 513.

Electrical connection 516 couples resistor 513 and the anode of diode 514 to the gate of an N-channel MOSFET 517. The source of MOSFET 517 is coupled to electrical connection 507 by electrical connection 519, and electrical connection 519 is coupled to electrical connection 548 and ground 108 by electrical connection 507. The drain of MOSFET 517 is coupled to electrical connection 520 by an electrical connection 518. Electrical connection 520 is coupled to a inductor 543. Inductor 543 is coupled to the first output terminal $OUT_1$ 601 of the amplifier by an electrical connection 544. In a specific preferred embodiment, inductor 543 is a 20-µH inductor. Electrical connection 528 couples a capacitor 547 to electrical connection 520 and inductor 543. An electrical connection 549 couples capacitor 547 to ground 108. In a specific preferred embodiment, capacitor 547 is a 1-µF capacitor. The combination of inductor 543 and capacitor 547 forms an LC filter configuration for the signal output at $OUT_1$ 601.

A terminal $T_9$ 499 is coupled by an electrical connection 551 to an electrical connection 553. Electrical connection 553 couples a capacitor 571 and a capacitor 555 together in series. An electrical connection 577 couples capacitor 571 to the anode of a diode 580. An electrical connection 579 couples the cathode of diode 580 to a terminal $V_H$ 214. An electrical connection 583 couples a resistor 584 to an electrical connection 579 and the cathode of diode 580 in a parallel circuit. An electrical connection 581 also couples electrical connection 577 and an electrical connection 582 to a resistor 586. An electrical connection 585 couples electrical connection 581 to the anode of a diode 587 in a parallel circuit to resistor 586. The cathode of diode 587 is coupled to an electrical connection 589 by an electrical connection 588.

An electrical connection 595 couples a capacitor 596 to electrical connection 579 and terminal $V_H$ 214 and the cathode of diode 580. In a specific preferred embodiment, capacitor 596 is a 0.47-µF capacitor. Electrical connection 598 couples capacitor 596 to ground 108.

An electrical connection 589 couples resistor 586 and an electrical connection 588 to the gate of a P-channel MOSFET 590. The source of MOSFET 590 is coupled to an electrical connection 579 by an electrical connection 591. The drain of MOSFET 590 is connected to an electrical connection 570 by an electrical connection 592.

Capacitor 555 is coupled to the cathode of a diode 560 by an electrical connection 554. An electrical connection 558 couples electrical connection 554 to a resistor 563. An electrical connection 552 couples electrical connection 558 to a resistor 561 in a parallel circuit to diode 560. An electrical connection 559 couples resistor 561 to an electrical connection 557. An electrical connection 562 couples the cathode of a diode 564 to electrical connection 552 in a parallel circuit to resistor 563. An electrical connection 565 couples the anode of diode 564 to an electrical connection 566, which is coupled to resistor 563.

Electrical connection 566 couples resistor 563 and the anode of diode 514 to the gate of an N-channel MOSFET 567. The source of MOSFET 567 is coupled to electrical connection 557 by electrical connection 569, and electrical connection 569 is coupled to an electrical connection 598 and ground 108 by electrical connection 557. The drain of MOSFET 567 is coupled to electrical connection 570 by an electrical connection 568. Electrical connection 570 is coupled to an inductor 593. Inductor 593 is coupled to the second output terminal $OUT_2$ 602 of the amplifier by an electrical connection 594. In a specific preferred embodiment, inductor 593 is a 20-µH inductor. An electrical connection 578 couples a capacitor 597 to electrical connection 570 and inductor 593. Electrical connection 599 couples capacitor 597 to ground 108. In a specific preferred embodiment, capacitor 597 is a 1-µF capacitor. The combination of inductor 593 and capacitor 597 forms an LC filter configuration for the signal output at $OUT_2$ 602. A load device (not shown), typically a speaker in audio applications, is connected to each of the outputs $OUT_1$ 601 and $OUT_2$ 602.

Figure 7:
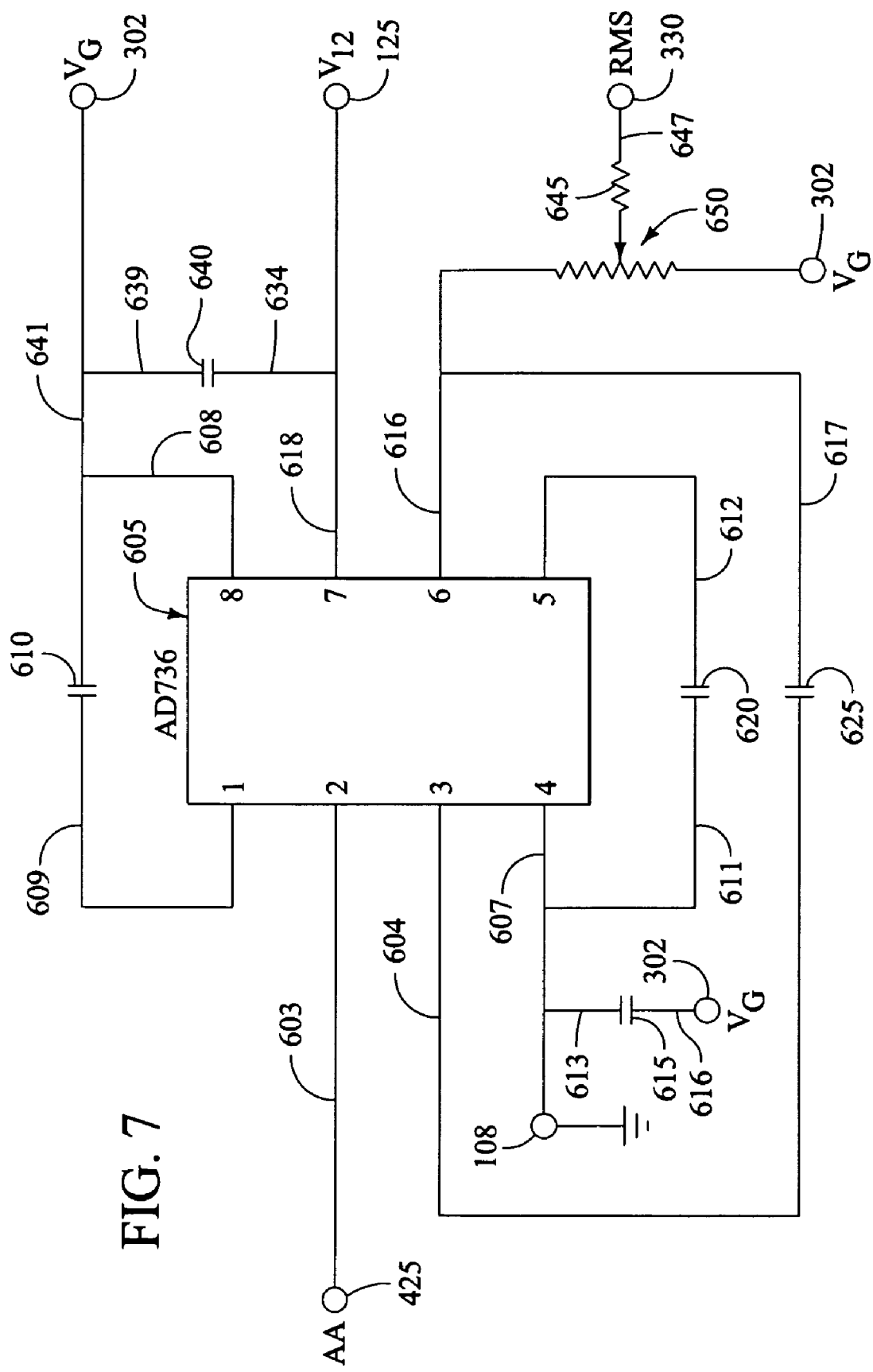
FIG. 7 is a circuit schematic of a preferred embodiment of the RMS-to-DC converter used to provide an additional signal for providing dynamic range compression, or Automatic Gain Control, to the amplifier circuit.

FIG. 7 illustrates an alternative preferred embodiment in which a dynamic range compression component is added to the circuit. In this embodiment, an RMS-to-DC converter integrated circuit 605 (RMS converter 605) provides modulation to compensate for volume changes in the input signal (e.g., dynamic range compression). The triangular wave, in addition to being modulated to compensate for power variances, is further modulated with the output of the RMS (root-mean-square) converter 605. The RMS converter 605 generates a signal relative to the RMS value of the audio input at AA 425 to obtain variable compression of the audio level. In a specific preferred embodiment, RMS converter 605 is an Analog Devices AD 736 RMS-to-DC converter integrated circuit. Pin 1 of RMS converter 605 is coupled to a capacitor 610 by an electrical connection 609. In a specific preferred embodiment, capacitor 610 is a 10-µF capacitor. Electrical connection 641 couples a terminal $V_G$ 302 to capacitor 610. An electrical connection 608 couples pin 8 of RMS converter 605 to electrical connection 641 and terminal $V_G$ 302. Pin 2 of RMS converter 605 is coupled to terminal AA 425 by an electrical connection 603 and is the input into RMS converter 605.

Pin 3 of RMS converter 605 is coupled to a capacitor 625 by an electrical connection 604. In a specific preferred embodiment, capacitor 625 is a 47-µF capacitor. The output of RMS converter 605 at pin 6 is coupled to a potentiometer 650 by electrical connection 616. Potentiometer 650 permits selectable, adjustable compression of the triangular wave modulated circuit. The wiper leading from potentiometer 650 is coupled to a resistor 645. Resistor 645 is coupled to an RMS terminal 330 by an electrical connection 647. In a specific preferred embodiment, resistor 645 is a 10K-ohm resistor. An electrical connection 652 couples potentiometer 650 to a terminal $V_G$ 302. Electrical connection 616 from the output pin 6 of converter 605 is coupled to capacitor 625 by electrical connection 617.

Pin 4 of converter 605 is coupled to an electrical ground 108 by an electrical connection 607. An electrical connection 613 couples a capacitor 615 to electrical connection 607. In a specific preferred embodiment, capacitor 615 is a 0.1-µF capacitor. An electrical connection 616 couples capacitor 615 to a terminal $V_G$ 302. An electrical connection 611 couples electrical connection 607 to a capacitor 620, and electrical connection 612 couples capacitor 620 to pin 5 of the converter 605. In a specific preferred embodiment, capacitor 620 is a 100-µF capacitor.

Pin 7 of converter 605 is coupled to a terminal $V_{12}$ 125 by an electrical connection 618. An electrical connection 639 couples electrical connection 641, and terminal $V_G$ 302, to a capacitor 640. An electrical connection 634 couples capacitor 640 to electrical connection 618 and the terminal $V_{12}$ 125. In a specific preferred embodiment, capacitor 640 is a 0.1-µF capacitor.

Figure 8:
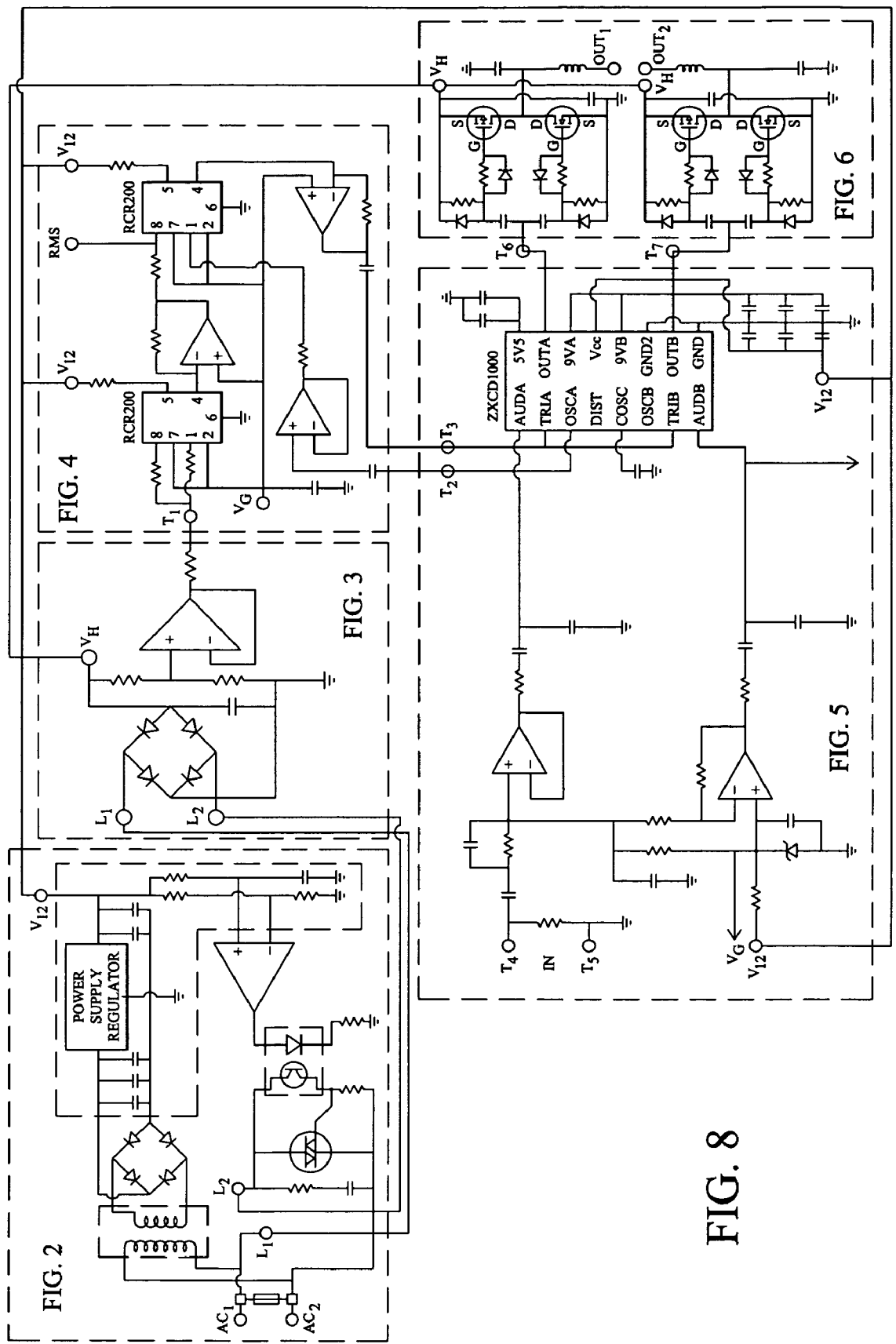
FIG. 8 is a composite circuit schematic of a preferred embodiment of the present invention for a modulated triangular wave audio power amplifier.

FIG. 8 illustrates the connectivity between the various circuit components described in detail hereinabove, showing the relationship between the rectifier and divider circuit of FIG. 3, the triangle wave modulator of FIG. 4, the pulse width modulator of FIG. 5, and the power device of FIG. 6, as might be implemented in a production circuit board.

FIG. 9 illustrates the internal operative connectivity for pulse width modulation controller 430 described in the preferred embodiment in detail in connection with FIG. 5.

OPERATION OF THE PREFERRED EMBODIMENTS

Figure 10:
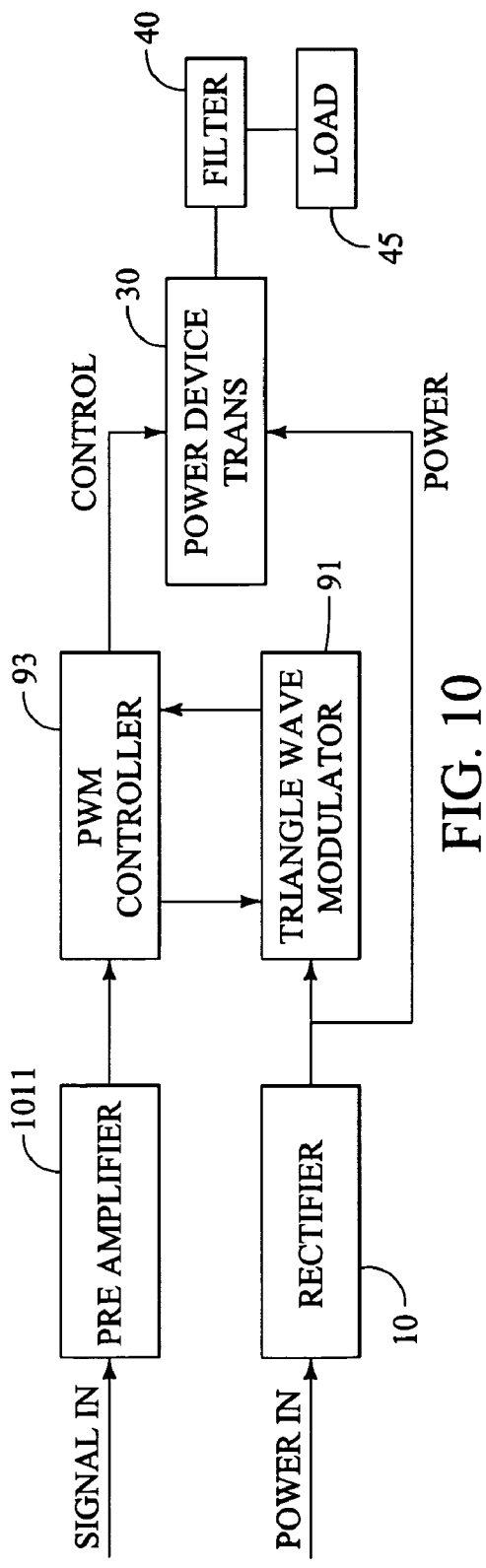
FIG. 10 is a block diagram of the modulated triangular wave audio power amplifier configured as a noise-canceling amplifier.

FIG. 10 illustrates in schematic, block diagram form, the modulated triangular wave amplifier as similarly illustrated in FIG. 1, according to a preferred embodiment of the present invention. In FIG. 10, the device is configured as a noise-canceling amplifier, which is capable of removing or canceling "ripple" from a power supply. Power is supplied to rectifier 10. A signal (such as an audio signal) to be amplified may be provided to an optional pre-amplifier 1011 to boost the signal strength. The amplified signal is then input to PWM controller 93, while rectified power (DC) is input to TWM 91.

A triangle (Δ) wave generated by triangle wave generator 91 (27 in FIG. 1, and described in detail in connection with FIG. 4) is coupled from PWM controller 93 and is modulated by TWM 91 and returned to PWM controller 93. The output of PWM controller 93 is input to power transistor device 30, which also receives rectified power from rectifier 10. Thus, the output of PWM controller 93 is employed to cancel noise present in the rectified power signal. The output of power transistor device 30 is typically applied to a filter 40 and then to a load 45, such as an audio speaker.

Figure 11:
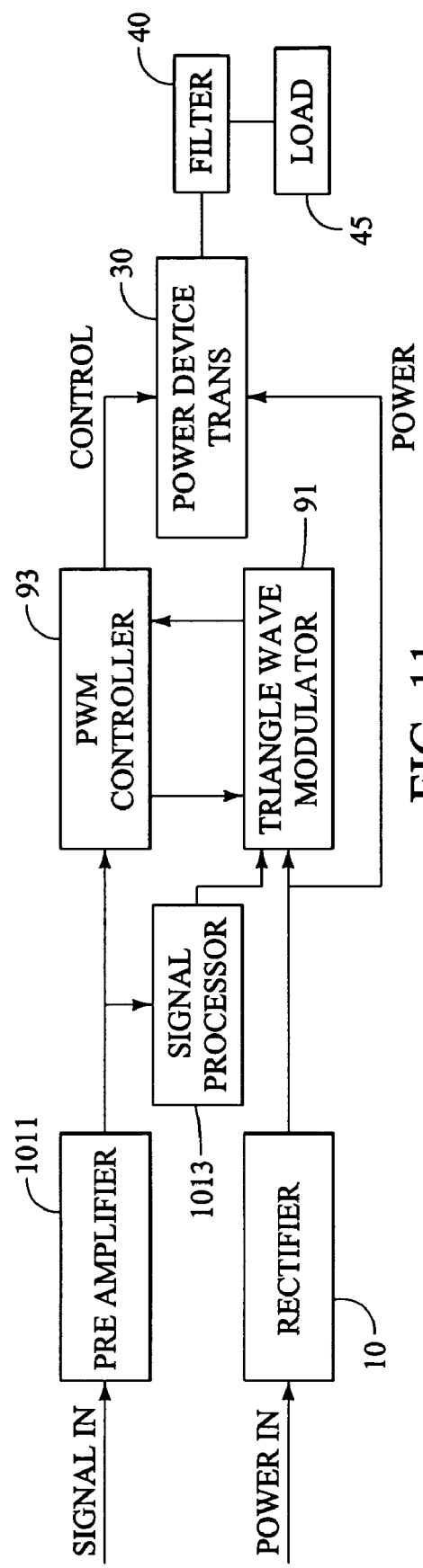
FIG. 11 is a block diagram of the modulated triangular wave audio power amplifier configured to compress or expand dynamic range or for signal equalization or cancellation.

FIG. 11 illustrates in schematic, block diagram form the modulated triangular wave amplifier according to another preferred embodiment of the present invention. In this preferred embodiment, the device is configured to modify the dynamic range of an input signal (i.e., to limit or enhance bandwidth, equalize the signal, or to compensate for, or cancel, signal elements). In this embodiment, power is supplied to rectifier 10, while a signal (such as an audio signal) to be modified may be provided to an optional pre-amplifier 1011 to boost the signal strength. Rectified power (DC) is input to TWM 91. The amplified signal is input to a Signal Processor 1013 coupled between the output of pre-amplifier 1011 and TWM 91. The amplified signal is also input, without signal processing, to PWM controller 93.

The choice of signal processor 1013 "type" corresponds with the desired modification to the signal. Thus, the output of PWM controller 93, with the addition of signal processing through TWM 91, is used in power transistor device 30 to accomplish the desired modification to the input signal, while power-supply noise-cancellation is also achieved. This configuration is most effectively adapted for audio input signals with an audio speaker load 45.

Figure 12:
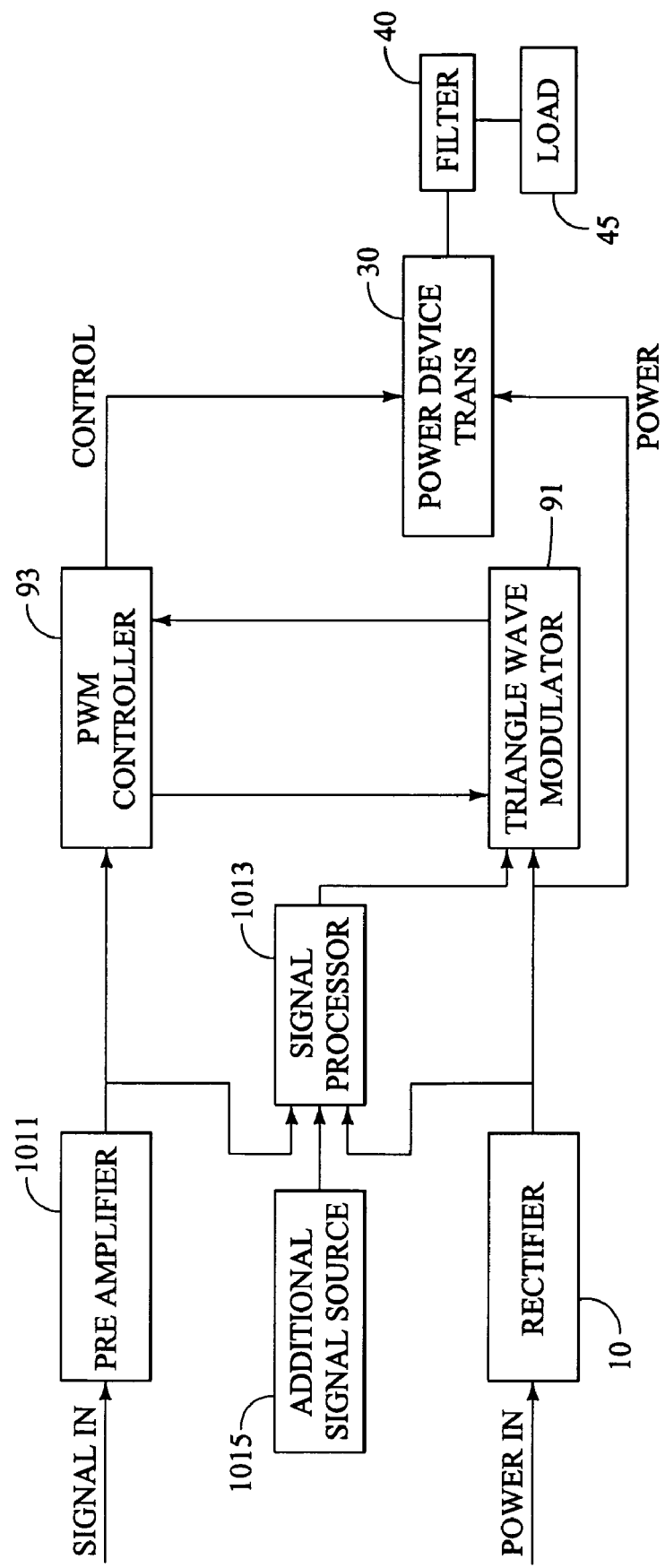
FIG. 12 is a block diagram of the modulated triangular wave audio power amplifier configured to introduce an additional signal to output.

FIG. 12 illustrates in schematic block diagram form, the triangular wave modulated amplifier, according to another preferred embodiment of the present invention. In this preferred embodiment, the device is configured to introduce an overlay or cancellation signal (pink noise, an advertisement, compensation for ambient noise, etc.) onto the output signal to load 45.

The overall configuration is identical to that in FIG. 11, with an additional signal source 1015 supplied to signal processor 1013. The signal processor 1013 then supplies the processed signal to TWM 91, which in turn affects the desired modification to the output signal of PWM controller 93. By this configuration, an overlay or background noise compensation signal may be added while power supply noise-cancellation is also provided.

In each of the embodiments of the present invention disclosed in FIG. 10, FIG. 11, and FIG. 12, it is understood that unregulated DC power may be supplied directly TWM 91, if DC power, rather than AC power, is the available power source.

While the invention has been particularly shown and described with respect to preferred embodiments, it will be readily understood that minor changes in the details of the invention may be made without departing from the spirit of the invention.

I claim:

1. An amplifier circuit, comprising:
   a rectifier for receiving an AC signal and for generating a rectified DC signal;
   a voltage divider circuit for receiving the rectified DC signal and for generating a unity voltage signal;
   a first multiplier circuit having a first and a second input terminal to which are applied the unity voltage signal, the first multiplier circuit generating a first multiplied signal;
   a second multiplier circuit having a first and a second input terminal to which are applied the first multiplied signal and a triangular wave signal, respectively, the second multiplier circuit generating a modulated triangular wave signal;
   a comparator circuit having a first and a second input terminal to which are applied the modulated triangular wave signal and an audio signal, respectively, the comparator circuit generating a pulse width modulated gating signal; and
   a transistor having a gate terminal to which is applied the pulse with modulated gating signal, the transistor generating an amplified signal responsive to the pulse width modulated gating signal.

2. The amplifier circuit of claim 1, wherein the rectifier is a full-bridge rectifier configured to rectify the AC signal.

3. The amplifier circuit of claim 1, wherein the voltage divider circuit comprises a first and a second resistor configured to generate the unity voltage signal, wherein the unity voltage signal includes an AC noise superimposed on a unity DC voltage.

4. The amplifier circuit of claim 1, wherein the first multiplied signal is equal to the square of the unity voltage signal applied to the first and second terminals of the first multiplier circuit.

5. The amplifier circuit of claim 1, further comprising a first capacitor coupled to the rectifier circuit.

6. The amplifier circuit of claim 1, further comprising a voltage follower circuit for receiving the unity voltage signal and for applying the unity voltage signal to the first and second input terminals of the first multiplier circuit.

7. The amplifier circuit of claim 1, further comprising an output filter for receiving the amplified signal and for generating a filtered audio signal.

8. The amplifier circuit of claim 7, wherein the output filter is an L-C filter.

9. The amplifier circuit of claim 1, further comprising a triangular wave generator circuit for generating the triangular wave signal being applied to the second input terminal of the second multiplier circuit.

10. The amplifier circuit of claim 7, wherein the filtered audio signal is applied to an electrical load.

11. A pulse width modulated amplifier circuit, comprising:
    a voltage divider configured to receive a rectified DC signal and operable to generate a unity voltage signal having a superimposed AC noise ripple;

a first multiplier circuit having a first and a second input terminal to which are applied the unity voltage signal having the superimposed AC noise ripple, the first multiplier circuit generating a first multiplied signal equal to the square of the applied signals to the first and second input terminals;

a second multiplier circuit having a first and a second input terminal to which are applied the first multiplied signal and a triangular wave signal, respectively, the second multiplier circuit generating a modulated triangular wave signal;

a triangular wave generator coupled to the second multiplier for generating the triangular wave signal;

a comparator circuit having a first and a second input terminal to which are applied the modulated triangular wave signal and an audio signal, respectively, the comparator circuit generating a pulse width modulated gating signal based on a comparison of the modulated triangular wave signal and the audio signal; and a transistor having a gate terminal to which is applied the pulse with modulated gating signal, the transistor generating an amplified signal responsive to the pulse width modulated gating signal.

12. The amplifier circuit of claim 11, further comprising an output filter for receiving the amplified signal and for generating a filtered audio signal.

13. The amplifier circuit of claim 12, wherein the output filter is an L-C filter.

14. The amplifier circuit of claim 12, wherein the filtered audio signal is applied to an electrical load.

* * * * *